United States Patent
Martin et al.

(10) Patent No.: US 7,265,692 B2
(45) Date of Patent: Sep. 4, 2007

(54) DATA COMPRESSION SYSTEM BASED ON TREE MODELS

(75) Inventors: Alvaro Martin, Palo Alto, CA (US); Gadiel Seroussi, Cupertino, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 549 days.

(21) Appl. No.: 10/821,524

(22) Filed: Apr. 9, 2004

(65) Prior Publication Data

US 2005/0171962 A1 Aug. 4, 2005

Related U.S. Application Data

(63) Continuation-in-part of application No. 10/768,904, filed on Jan. 29, 2004.

(51) Int. Cl.
*H03M 7/00* (2006.01)
(52) U.S. Cl. ........................... 341/107; 707/101
(58) Field of Classification Search ................ 341/107, 341/50, 51; 707/101
See application file for complete search history.

(56) References Cited

U.S. PATENT DOCUMENTS 6,401,088 B1 * 6/2002 Jagadish et al. ............... 707/6
7,028,042 B2 * 4/2006 Rissanen ..................... 707/101

OTHER PUBLICATIONS

Alvaro Martin, et al., "Linear Time Universal Coding and Time Reversal of Tree Sources via FSM Closure," HPL-2003-87, Apr. 2003.
R. Giegerich and S. Kurtz, "From Ukkonen to McCreight and Weiner: A unifying view to linear-time suffix tree construction," Algorithmica, vol. 19, pp. 331-353, Nov. 1997.

* cited by examiner

*Primary Examiner*—Rexford Barnie
*Assistant Examiner*—Joseph Lauture

(57) ABSTRACT

A method for encoding and decoding a sequence is provided. The method comprises searching a set of candidate trees varying in size for a tree T having a plurality of states. Tree T provides a structure that relatively minimizes code length of the sequence from among all the candidate trees. The method further comprises encoding data conditioned on the tree T, which may be a generalized context tree (GCT), using a sequential probability assignment conditioned on the states of the tree T. This encoding may use finite state machine (FSM) closure of the tree. Also provided are methods for decoding an encoded binary string when the encoded string includes a full tree or generalized context tree, as well as decoding an encoded string using incomplete FSM closure, incremental FSM, and suffix tree construction concepts.

30 Claims, 14 Drawing Sheets

FIG. 12

```
1.  Set T̂'(x) = compact (T(x) − leaves(T(x)))
2.  Compute T̂'_F(x), FSM closure of T̂'(x)
3.  Set ŝ = λ  //Pointer to root node
4.  Set zlength = 0 and b = λ
5.  while not end of input
6.     if zlength > 0
7.        Determine head(z) using symbols decoded so far
8.        if ŝ is an internal node of T(x) and head(z) ∈ A, set s = ŝzb
9.        else if ŝ is an internal node of T(x) and head(z) ∉ A_ŝ, set s = ŝhead (z)
10.       else if ŝ is a leaf of T(x), set s = ŝ
11.       else set s = Origin [ŝ]
12.       //Note: in any case s is a pointer to a node in T(x)
13.    else
14.       if ŝ is a node of T(x), set s = ŝ
15.       else set s = Origin[ŝ]
16.    end if
17.    Decode next symbol using statistics in s
18.    Update statistics in s
19.    Set ŝ to next state in T_F according to the decoded symbol
20.    Update values of zlength and b
21. end while
```

Decoding Using Incomplete FSM closure

1. Set $\hat{T}'(x)$ = compact(T(x) − leaves(T(x)))
2. Compute $\tilde{T}'_F$, FSM closure of T'(x)
3. Set $\tilde{s} = \lambda$ //Pointer to root node
4. Set $\widetilde{zlength} = 0$ and $\tilde{b} = \lambda$
5. while not end of input
6.    if $\widetilde{zlength} > 0$
7.       Determine head $(\tilde{z})$ and symbols decoded so far
8.       Create node $\tilde{s}\tilde{z}$ splitting edge departing from $\tilde{s}$ which first symbol is head$(\tilde{z})$
9.       Set $r = \tilde{s}\tilde{z}$
10.      Set Transitions[r] = Transitions[$\tilde{s}$]
11.      Verify*(r)
12.    else
13.       Set r = s
14.    end if
15.    if $\tilde{b} \neq \lambda$
16.       Create node $r\tilde{b}$
17.       Set Transitions[$r\tilde{b}$] = Transitions[r]
18.       Verify*($r\tilde{b}$)
19.       Set $s = r\tilde{b}$
20.    else
21.       Set s = r
22.    end if
23.    Decode next symbol using statistics in Origin[s]
24.    Update statistics in Origin[s]
25.    Set $\tilde{s}$ to next state in $\tilde{T}'_F$ according to the decoded symbol
26.    Update values of $\widetilde{zlength}$ and $\tilde{b}$
27. end while Decoding Using Incremental FSM closure

Decoding Using Incremental Suffix Tree Construction

1.  Initialize short-cut links for T(x)
2.  Set r' = λ and s = λ
3.  while not end of input
4.      Decode $x_i$ using statistics in s
5.      //Upwards traversal
6.      Set v = r'
7.      while v ≠ λ and v has no short-cut link of v for $x_i$
8.          Set v = PARENT(v)
9.      end while
10.     if v has a short-cut link for $x_i$
11.         Set w – node pointed by short-cut link of v for $x_i$
12.     else
13.         Set w = λ
14.     end if
15.     if |w| > |v| + 1
16.         Split edge from PARENT(w) to w inserting node $x_i$ v
17.         Set $r_{new}$ = $x_i$ v
18.         Set u = v
19.         while short-cut of u for $x_i$ = w
20.             Set short-cut link of u for $x_i$ pointing to $r_{new}$
21.             if u ≠ λ, set u = PARENT(u)
22.         end while
23.     else
24.         //Downwards traversal
25.         if Jump[v] defines a mapping for $x_i$
26.             Set $r_{new}$ = last entrance of Jump[v] for $x_i$
27.         else
28.             Set $r_{new}$ = w
29.             Set j = $|r_{new}|$
30.             while i – j > 0 and $r_{new}$ has a child in the direction of $x_{i-j}$
31.                 Set $r_{new}$ = child of $r_{new}$ in the direction of $x_{i-j}$
32.                 Update Jump [v]
33.                 Increment j
34.             end while
35.         end if
36.     end if
37.     Add child to $r_{new}$ representing suffix $\bar{x}^i$
38.     For all nodes in the path from r' to v (excluded)
39.         Set short-cut link for symbol $x_i$ pointing to the new node $\bar{x}^i$
40.     end for
41.     Set r' = $r_{new}$
42.     Set s = longest prefix of $\bar{x}^i$ that was originally in T(x)
43. end while

DATA COMPRESSION SYSTEM BASED ON TREE MODELS

This application is a continuation-in-part of co-pending U.S. patent application Ser. No. 10/768,904, entitled "FSM Closure of Generalized Tree Models," inventors Alvaro Martin, et al., filed Jan. 29, 2004, the entirety of which is incorporated herein by reference.

BACKGROUND OF THE INVENTION

1. Field of the Invention

The present invention relates generally to the field of data compression, and more specifically to linear time universal coding for the class of tree models.

2. Description of the Related Art

Information sources emit symbols from a given alphabet according to some probability distribution. In particular, finite memory sources employ a finite number of contiguous past observations to determine the conditional probability of the next emitted symbol. In many instances employing conditional probability prediction, the memory length, i.e. the number of past symbols that determine the probability distribution of the next one, depends on the data received and can vary from location to location. Due to this variance in memory length, a Markov model of some order m fit to the data is generally not efficient in determining conditional probability for next emitted symbols. In such a Markov model, the number of states grows exponentially with m, thus providing a significantly complex resultant model including equivalent states yielding identical conditional probabilities. In general, when considering a Markov model, removing redundant parameters and reducing the total number of states can provide enhanced overall performance.

Reduced Markov models of information sources have been termed "tree models," as they can be graphically represented using a simple tree structure. A "tree model" includes an underlying full $\alpha$-ary tree structure and a set of conditional probability distributions on the alphabet, one associated with each leaf of the tree, where each leaf corresponds to a "state." An $\alpha$-ary tree structure includes, for example, binary trees, tertiary trees, and so forth, where $\alpha$ is the size of the source alphabet A. The model associates probabilities to sequences as a product of symbol probabilities conditioned on the states. The appeal of tree models is the ability to capture redundancies typical of real life data, such as text or images, while at the same time providing the ability to be optimally estimated using known algorithms, including but not limited to the Context algorithm. Tree models have been widely used for data modeling in data compression, but are also useful in data processing applications requiring a statistical model of the data, such as prediction, filtering, and denoising.

The use of statistical models, such as tree models, in lossless data compression is facilitated by arithmetic codes. Given a sequence x of length n over the alphabet A, and a statistical model that assigns a probability P(x) to the sequence x, an arithmetic encoder can efficiently assign a codeword (for example, over the binary alphabet {0,1}) of length slightly larger, but as close as desired, to the smallest integer not smaller than log (1/P(x)), where the logarithm is taken in base 2. A corresponding decoder can decode the codeword to recover the sequence x. For the code to be effective, the goal is to make the code length as short as possible, and lossless data compression requires exact recovery of the original sequence x by the decoder. A universal lossless data compression system aims to assign to every sequence x a codeword of length that approaches, as the length n of the sequence grows, the length assigned by the best statistical model in a given "universe" or class of models. When the statistical models are determined by K free parameters, for most sequences x this target can only be achieved up to an excess code length of (K log n)/(2n)+O (K/n) bits per input symbol. While increasing the dimensionality K of the class of models decreases the target code length, the unavoidable excess code length over this target code length increases. An optimal lossless data compression system aims at finding the best trade-off value for the number of parameters K.

For the class of tree models of any size, this optimal trade-off is achieved by codes such as CTW and Context. Any given tree determines a class of tree models with a number of free parameters K given by the number of its states times $\alpha-1$, since $\alpha-1$ free parameters per state determine each conditional distribution. For any tree having K free parameters and any sequence of length n, CTW and Context provide, without prior knowledge of the tree or K, a normalized excess code length of at most (K log n)/(2n)+ O(K/n) bits over the shortest code length assigned by the best tree model supported by the tree. In the "semi predictive" variant of Context, a system seeks to estimate a best tree model, and describes the corresponding best tree to a decoder in a first pass. Determination of the best tree takes into account the number of bits needed to describe the tree itself, and a code length based on model parameters that are sequentially estimated by the encoder. The system sequentially encodes data based on the described tree in a second pass, using the model parameters estimated sequentially. Therefore, the parameters dynamically change during the encoding process. Given the tree, the decoder can mimic the same estimation scheme and therefore it needs not be explicitly informed of the parameters by the encoder. Such a design is suggested in, for example, J. Rissanen, "Stochastic complexity and modeling," Annals of Statistics, vol. 14, pp. 1080-1100, September 1986. Determination of the best tree model requires "pruning" a tree, called a context tree, containing information on all occurrences of each symbol in every context. The second pass encoding entails assigning a conditional probability to each symbol sequentially based on previous occurrences of symbols in its context, and encoding the symbol using an arithmetic code. The decoder can reverse the second pass encoding operations.

One problem with using tree models is the cost associated with transitioning from one state to the next state. In principle, for a general tree model, knowledge of the current state and the next input symbol might not be sufficient to determine the next state. Determination of the latter generally entails traversing the tree from its root, and following branches according to the sequence of symbols preceding the current symbol. For general trees, such a procedure typically requires a number of steps that cannot be bounded by a constant. Thus, transitioning from one state to another is generally expensive from a computational perspective, and use of such trees can add complexity to the system.

Another computational problem with using tree models is that efficient implementations thereof require that the data collection to build the context tree be done in a compact suffix tree of the encoded sequence. Since compact trees need not be full, and their edges may be labeled by strings of length greater than one, the tree corresponding to the optimal tree model for a given sequence will generally not be a sub-tree of the suffix tree of the sequence, as it may contain paths not in the original sequence but were added to make the tree full. This phenomenon complicates the pruning process.

On the other hand, certain popular data compression algorithms, such as PPM and algorithms based on the Burrows-Wheeler transform, or BWT, are also based on tree models, but do not achieve optimal redundancy as the CTW and Context methods.

Based on the foregoing, it would be advantageous to offer a relatively simple coding method, which is relatively optimal for the class of tree models, using trees or tree structures in an efficient manner.

SUMMARY OF THE INVENTION

According to a first aspect of the present design, there is provided a method for encoding a sequence into a concatenated string. The method comprises building a suffix tree of the sequence in reverse order, pruning the suffix tree to form a generalized context tree (GCT) having a plurality of states, obtaining a binary representation of a full tree derived from the GCT, encoding the sequence into a binary string using a dynamic tree model based on statistics collected at the plurality of states of the GCT, and concatenating the binary representation of the full tree with the binary string to form the concatenated string.

According to a second aspect of the present design, there is provided a method for encoding a sequence into a concatenated string. The method comprises building a suffix tree of the sequence in reverse order, pruning the suffix tree to form a generalized context tree (GCT) having a plurality of states, building a finite state machine (FSM) closure of the GCT to form an FSM closed GCT, obtaining a binary representation of a full tree derived from the GCT, encoding the sequence into a binary string using a dynamic tree model based on statistics collected at the plurality of states of the GCT, transitioning to a next state of the GCT with the FSM closed GCT, and concatenating the binary representation of the full tree with the binary string to form the concatenated string.

According to a third aspect of the present design, there is provided a method for decoding a binary string, the binary string comprising a binary representation of a full tree having a plurality of states associated therewith, and an encoded string produced by a corresponding encoder using a dynamic tree model based on the full tree. The method comprises building a finite state machine (FSM) closure of the full tree, iteratively decoding at least one symbol using the dynamic tree model of the corresponding encoder based on statistics collected at the plurality of states of the full tree, and transitioning to the next state of the full tree using the FSM closed full tree.

According to a fourth aspect of the present design, there is provided a method for decoding a binary string, the binary string comprising a binary representation of a generalized context tree (GCT) and an encoded string produced by a corresponding encoder using a dynamic tree model based on the GCT, the GCT having a plurality of states associated therewith. The method comprises building a decoding GCT based on the binary representation of the GCT, building a finite state machine (FSM) closure of the decoding GCT, iteratively decoding at least one symbol using the dynamic tree model of the corresponding encoder based on statistics collected at the plurality of states of the decoding GCT, and transitioning to a next state of the decoding GCT using the FSM closed decoding GCT.

According to a fifth aspect of the present design, there is provided a method for decoding a binary string, the binary string comprising a binary representation of a full tree and an encoded string produced by a corresponding encoder using a dynamic tree model based on the full tree, the full tree having a plurality of states associated therewith. The method comprises building a decoding full tree based on the binary representation of the full tree, creating a reduced generalized context tree (GCT) and mapping the reduced GCT to the decoding full tree, building a finite state machine (FSM) closure of the reduced GCT, iteratively decoding at least one symbol using the dynamic tree model of the corresponding encoder based on statistics collected at the plurality of states of the decoding full tree, and transitioning to a next state of the decoding full tree using the FSM closed reduced GCT.

According to a sixth aspect of the present design, there is provided a method for decoding a binary string, the binary string comprising a binary representation of a full tree and an encoded string produced by a corresponding encoder using a dynamic tree model based on the full tree, the full tree having a plurality of states associated therewith. The method comprises building a decoding full tree based on the binary representation of the full tree, creating a reduced generalized context tree (GCT), building a finite state machine (FSM) closure of the reduced GCT, iteratively decoding at least one symbol using the dynamic tree model of the corresponding encoder based on statistics collected at the plurality of states of the decoding full tree, transitioning to a next state of the decoding full tree using the FSM closed reduced GCT, and adding encountered states of the decoding full tree and suffixes thereof to the FSM closure of the reduced GCT.

According to a seventh aspect of the present design, there is provided a method for decoding a binary string ty, formed by concatenating binary strings t and y, into a resultant string x, the binary string ty comprising a binary representation t of a tree T and an encoded stringy produced by a corresponding encoder using a dynamic tree model based on the tree T. The method comprises building the tree T based on the binary representation t, setting the resultant string x to an empty string, iteratively decoding at least one symbol using the dynamic tree model of the corresponding encoder based on statistics collected at a state given by a longest ancestor of the reversed resultant string x originally in T and filling the resultant string x with decoded symbols, and inserting the reversed resultant string x in T.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which:

FIG. 12 is the processing of the decoder according to the concept of an incomplete FSM closure;

FIG. 13 shows the processing of the decoder according to the concept of an incremental FSM closure construction; and FIG. 14 is the processing of the decoder according to the concept of incremental suffix tree construction.

DETAILED DESCRIPTION OF THE INVENTION

Figure 1:
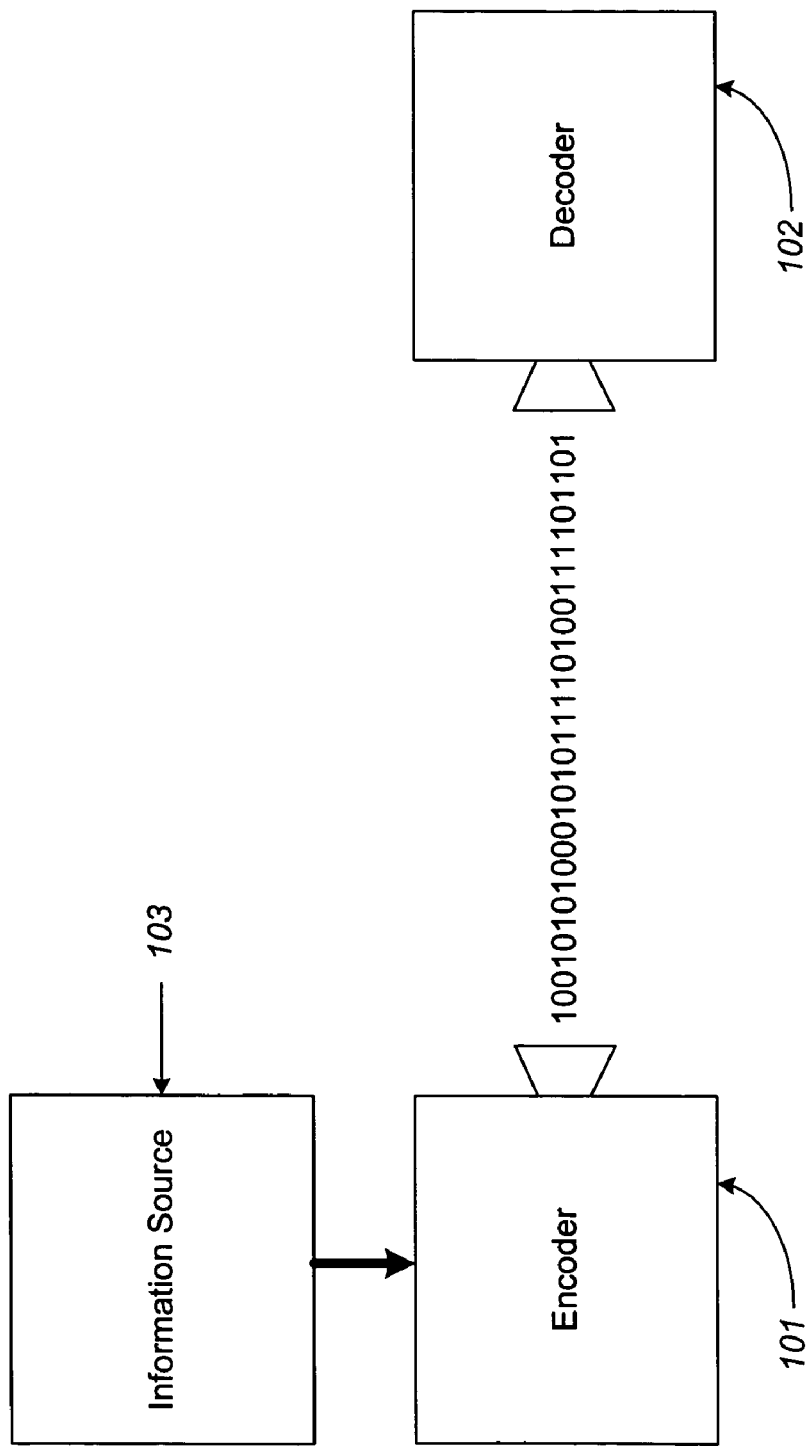
FIG. 1 illustrates a basic encoder-decoder design for a source, such as an information source.

The present design operates by taking a sequence, constructing a Generalized Context Tree (GCT) that models a source that could have emitted the sequence, and optionally refining the GCT by adding leaves and/or internal nodes, where necessary, such that the refined GCT has a finite state machine (FSM) property. Such construction is referred to as computing an "FSM closure" on the GCT, thereby forming a resultant tree, and is described in detail in U.S. patent application Ser. No. 10/768,904, entitled "FSM Closure of Generalized Tree Models," inventors Alvaro Martin et al., the entirety of which is incorporated herein by reference. Intermediate trees may be formed in the process, such as when filling the GCT with leaves and/or internal nodes. The present design may alternately be considered to receive a string, build a suffix tree of the string in reverse order, prune the suffix tree to form a pruned tree, and build an FSM closure of the pruned tree to form an FSM closed tree. The FSM closed tree is used by the present system to sequentially assign probabilities to the symbols in the input sequence, with the purpose of, e.g., encoding the sequence. The present system provides information about the pruned tree to a decoder, which can reconstruct the FSM closure and utilize the tree in various ways to decode the sequence. Tree construction, encoding, and reconstruction processes may operate in a time frame linear in the length of the input string. The present design discloses the manner in which the sequence may be encoded and various ways in which the resultant bitstream may be decoded.

Definitions

As used herein, the terms "algorithm," "program," "routine," and "subroutine" will be generally used interchangeably to mean the execution functionality of the present design. The term "subroutine" is generally intended to mean a sub program or ancillary algorithm, called from the main program, that may be associated with or subordinate to the main program or algorithm.

Also as used herein, A represents an alphabet of a available symbols, $\alpha$ being greater than or equal to 2. The values $A^*$, $A^+$, and $A^m$ denote, respectively, the set of finite strings, the set of positive length strings, and the set of strings of length m, where m is greater than 0, over the set of symbols.

Variables a, b, and c represent symbols from alphabet A, while r, s, t, u, v, w, x, y, and z represent strings in $A^*$. The notation $x_i$ is used to denote the i-th symbol of x, while $x^i$ denotes the sub string $x_1 x_2 \ldots x_i$. The reverse of a string x is $\bar{x}$, equal to $x_k x_{k-1} \ldots x_i$, where k is the length of x. Length of a string x is represented as |x|. The null string, a string of length zero, is denoted $\lambda$. "uv" is the concatenation of strings u and v.

Further, as used herein, the terms "prefix" and "suffix" are illustrated by, for example, a string t equal to uvw, where u, v, and w are also strings. In this case, u is a "prefix" of t, v is a "t-word," and w is a "suffix" of t. The phrase "u is a prefix of v" is written as "u≼v." If u is prefix of v and |u| is less than |v|, u is said to be a "proper prefix" of v. An analogous definition applies to "proper suffix". For a string u, head(u) is the first symbol of u, and tail(u), also known as the suffix tail, is its longest proper suffix.

Figure 2A:
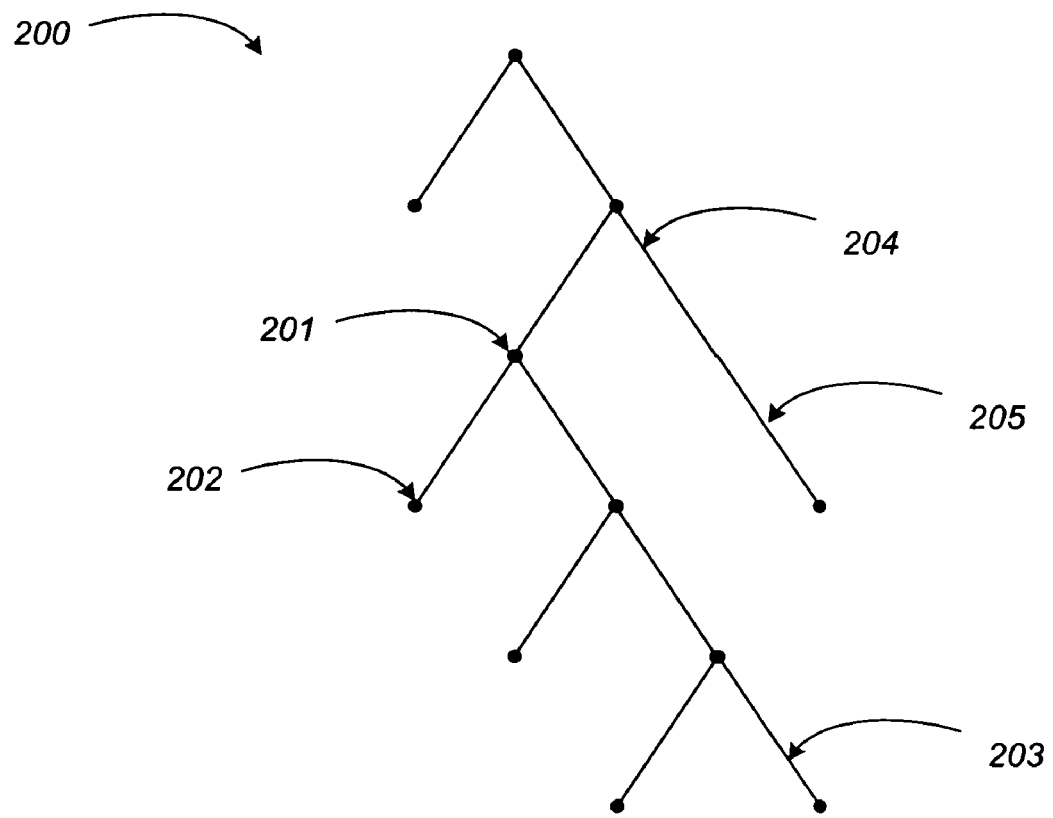
FIG. 2A represents a binary tree structure.

A typical binary tree structure is illustrated in FIG. 2A for purposes of identifying the terminology used herein. Tree structure 200 includes a set of "nodes" such as node 201 or node 202. Nodes are joined by "edges," such as edge 203. Edges are assumed to be directed, or have a direction associated therewith. In the example binary tree structure of FIG. 2A, and in the other illustrations of this application, edges are directed from top to bottom. If an edge originates at node x and ends at node y, x is the "parent" of y, and y is a "child" of x. Each node has a unique parent, except for one distinguished node referred to as the "root." In FIG. 2A, node 210 is the root, and node 201 is the parent of nodes 202 and 212, which are the children of node 201. A "leaf" is a node with no children, such as node 202. An "internal node" is any node, such as node 201, that is not a leaf.

Each edge in the tree is labeled with a string from $A^+$, such as string "11" in edge 204, or string "1" in edge 203. Edges departing from a node are typically labeled with strings starting with different symbols, and each node has at most as many children as the size of the alphabet $\alpha$. An edge is "atomic" if it is labeled by a single-symbol string, such as edge 203 in FIG. 2A. An edge that is not atomic is called "composite," such as edge 204. The term "atomic tree" designates a tree where every edge in the tree is atomic. Every node in a tree is associated with a string, composed by concatenating the labels of all the edges in the path from the root to the node. For example, in FIG. 2A, node 213 is associated with the string "10111," and node 214 is associated with the string "111." Nodes are identified herein by their associated strings. For instance if u is a string, the node whose associated string equals u will be simply referred to as "node u". Also, all operations defined over strings may be applied to nodes with the understanding that the operations are applied to the associated strings. For example if v is a node, |v| denotes the length of the string associated to node v.

Figure 4:
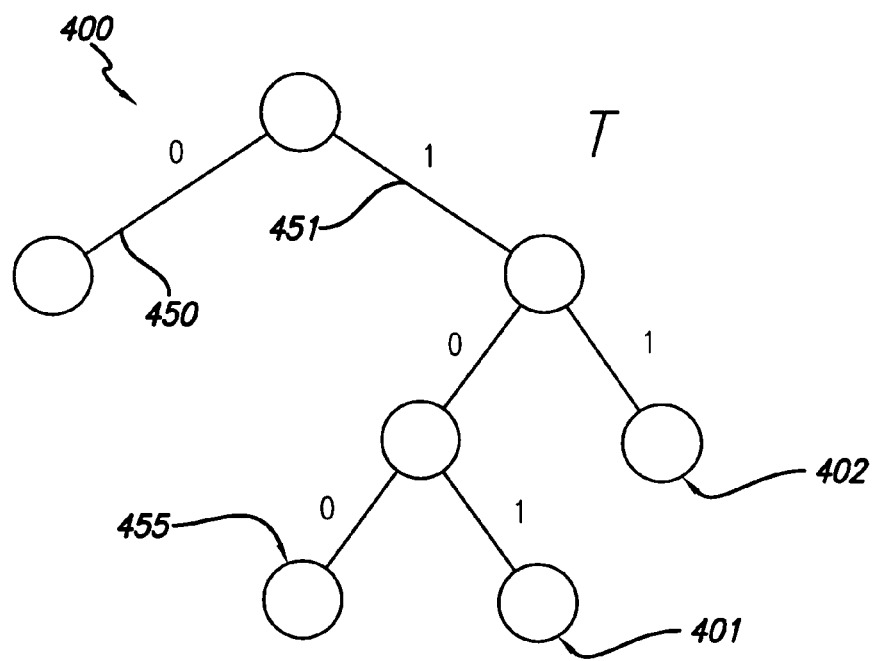
FIG. 4 is a binary context tree.

A node is called a "branching node" if it has at least two children. A tree is "compact" if every node in T is either the root, a leaf, or a branching node. A tree is "full" if the tree is atomic and the number of branches emanating from every node is either zero or $\alpha$, where $\alpha$ is the size of the alphabet A. In the case of a binary tree, for example, $\alpha$ is 2, and a full tree has two branches emanating from every internal node, with no branches emanating from any leaf. FIG. 4 illustrates a full binary tree.

Consider a string $x_1 x_2 \ldots x_n$, and its substring $x_1 x_2 \ldots x_i$, with i less than n, and a full tree T. Starting at the root, and following branches by matching their labels to symbols from the reversed substring $x_i x_{i-1} \ldots x_i$, one eventually reaches a leaf of T, provided the number i is large enough (e.g., larger than the length of the longest string associated with a leaf of T). That leaf is referred to as the "state" determined by the string $x_1 x_2 \ldots x_i$, which is also the state in which symbol $x_{i+1}$ is processed in data processing applications using the tree T. For example, for the tree T of FIG. 4, the state determined by string "010111" is leaf 402. Full trees used for determining states are termed "context trees" as the state used for processing $x_{i+1}$ corresponds to a sub-string of x preceding $x_{i+1}$, known as a "context" for that occurrence of the symbol in x.

When a tree T is not full or when it is not atomic, nodes that are not leaves may determine states. In general, for sufficiently large i, the state determined by $x^i$ is the last node of the tree visited while traversing the tree as described above, before "falling off" the tree. For example, for the tree of FIG. 2A, the state determined by string "1010011" is node 205. In this case, the tree is termed a Generalized Context Tree, or GCT.

A tree can be considered a set of strings, namely the set of strings associated with the tree's nodes and all its prefixes. Each string belonging to the set of strings represented by a tree T is said to be a word of T and the set may be denoted WORDS(T).

As used herein, the term "suffix tree" is used interchangeably with the term "compact suffix tree". The suffix tree or compact suffix tree of a string t refers to a compact representation of a tree T such that WORDS(T) equals the set of all t-words.

FIG. 1 illustrates a simplified version of an arrangement wherein the present design may be employed. Encoder 101 encodes the symbol stream received from a source 103, such as an information source, and may contain the algorithm disclosed herein as well as the hardware on which the algorithm operates. Alternately, a third location (not shown) may be employed to operate the algorithm and transmit the optimized tree structure(s) to the encoder 101 and decoder 102. Decoder 102 receives the tree structure and thus the states computed by the algorithm, as well as the encoded series of symbols, and decodes the symbols and reassembles the string. In a typical environment, the medium for transmission may be over the air, over wire, or any other medium known for transmission of signals.

Generalized Context Trees Finite State Machines, and FSM Closure

Generalized Context Trees and Finite State Machines are two different ways of assigning a unique state from a finite set to any string $x^k$ of A*. In the case of GCTs, the state is determined, for sufficiently long strings, by the last node visited while traversing the tree from the root following the path determined by $\bar{x}$, before "falling off" the tree. More formally, for a GCT T and arbitrary string y, the canonical decomposition of y with respect to T is $C_T(y)$ equals (r, u, v), where r is the longest prefix of y that is a node of T, ru is the longest prefix of y that is a word of T, and y equals ruv. The first component of $C_T(y)$, namely r, is denoted $V_T(y)$.

Figure 2B:
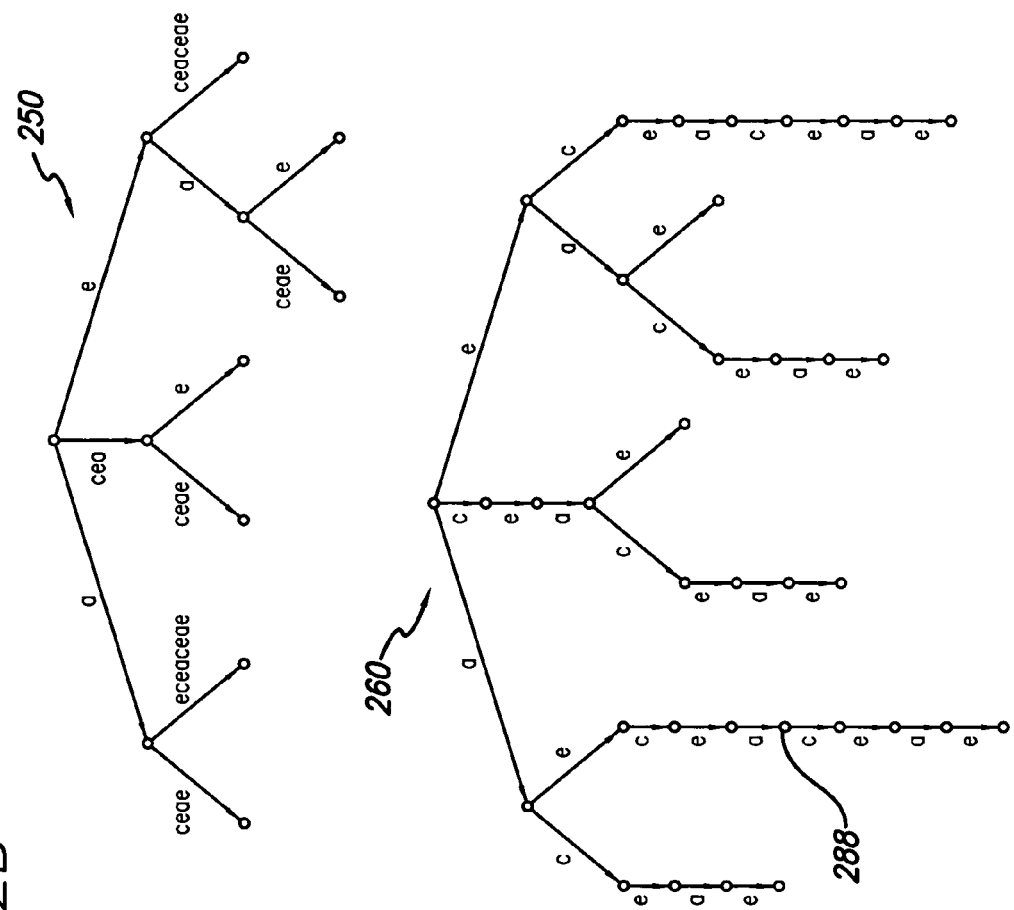
FIG. 2B presents two trees for the string aeceaceae.
Figure 3:
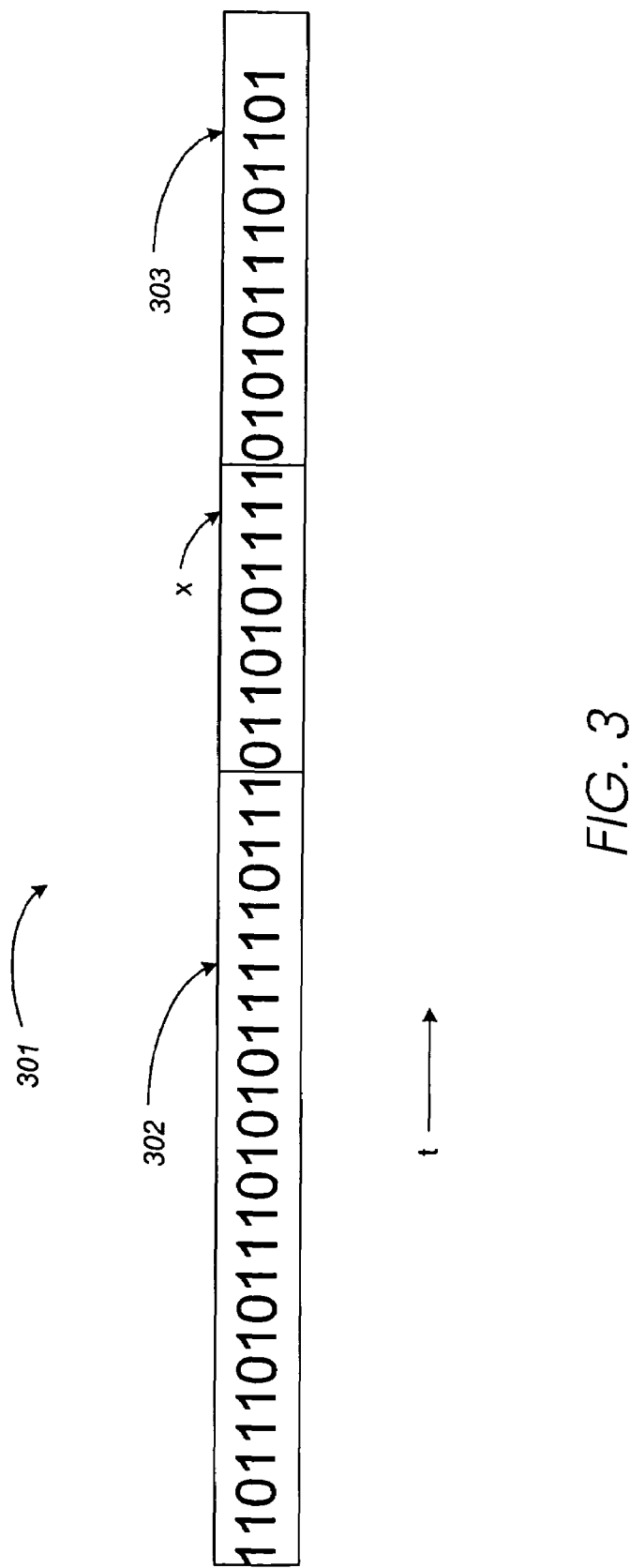
FIG. 3 illustrates a string x having a prefix and suffix.

As shown in FIG. 2B, a canonical decomposition follows the path defined by y starting at the root and proceeds down the tree T by matching symbols on its edge labels. r is the last node visited, and v is the suffix of y starting at the mismatch point, or the part of y that falls off the tree. From FIG. 2B, assume y is the string aeceaecae. For the upper tree 250, beginning with the root, progression moves forward to node a and symbols e, c, e, a before falling off. In this case, r equals node a, u equals "ecea" and v is "ecae". For the non-compact lower tree 260 of FIG. 2B, beginning with the root, progression moves forward to a, e, c, e, a, and then the "ecae" string falls off the tree. Thus node 288 is the last node, or r, u is the null string and v is the suffix "ecae." r, u, and/or v may be null strings.

For a given tree T, $S_T$ represents the set of nodes s such that s has less than $\alpha$ children, or s has a composite outgoing edge. $S_T^\$$ denotes the set of strings w\$ where \$ is a special symbol that does not belong to the alphabet, and w is a word of T that is not a leaf of T. The set of states for T is defined as the union of $S_T$ and $S_T^\$$, $S_T^A = S_T \cup S_T^\$$.

The function that assigns states to strings for a given tree T is known as the "tree-state function" and is defined as $s_T$: $A^* \rightarrow S_T^A$ and $$s_T(x^n) = \begin{cases} V_T(\bar{x}^n) & \text{if } V_T(\bar{x}^n z) = V_T(\bar{x}^n) \ \forall\, z \in A^* \\ \bar{x}^n \$ & \text{otherwise.} \end{cases} \quad (1)$$

The symbol \$ can be interpreted as a conceptual marker preceding the first actual symbol of $x^n$.

The first case of Equation (1) is true for sufficiently long strings, and in this case $s_T(x^n) \in S_T$. For short strings, the second case in Equation (1) may be true, in which case $s_T(x^n) \in S_T^\$$. Note that only one string selects each state in $S_T^\$$. These states are called "transient states". On the other hand, arbitrarily long strings select states in $S_T$, and these states are termed "permanent states".

When T is a "full tree," the set of permanent states of GCT T is equal to the set of end nodes or leaves. For the GCT of FIG. 4, for example, $S_T$, or the set of states of tree T, is {0, 100, 101, 11}.

A finite state machine (FSM) over A is defined as:

$$F = (S, f, s_o) \quad (2)$$

where S is a set of states, $f: S \times A \rightarrow S$ is a next state function, and $s_o$, an element of S, is the initial state. For an FSM, the state function is recursively defined by the next state function starting from initial state $s_0$, or in other words the state assigned to a string $x^k$ is $f(\ldots f(f(s_0, x_1), x_2) \ldots, x_k)$. The concept of "permanent state" is also defined for an FSM where a state s is "permanent" if there exist arbitrarily long strings $x^i$ such that $f(\ldots f(f(s_0, x_1), x_2) \ldots, x_i)$ equals s, or in other words $x^i$ selects state s. Otherwise, the state is "transient."

A GCT has the FSM property, or the tree "is FSM," if the tree T defines a next state function $f: S_T^A \times A \rightarrow S_T^A$ such that for any sequence $x^{n+1}$, $$s_T(x^{n+1}) = f(s_T(x^n), x_{n+1}) \quad (3)$$

For the binary tree of FIG. 4, the state following the transmission of a 1 at state 0 in tree 400 could either be "100" or "101." The tree therefore does not have the finite state machine property. The system therefore needs additional past symbols to make a conclusive determination of the state beyond the symbols provided by the length-one context at root node 403.

One possible way of verifying whether a GCT T is FSM is by means of the "suffix property." If, for every permanent state s, the suffix tail(s) is a node of T, then T is FSM. In this case, the next state function f satisfies, for all $a \in A$, f(s,a) equals $V_T(as)$, where $V_T(as)$ represents the first element, r, of $C_T(as)$.

Note that the GCT 400 in FIG. 4 does not satisfy the suffix property because the descendants of node 451 are not replicated at node 450, i.e. neither suffix "00" nor suffix "01" is present. To make a tree T that is not FSM into a tree that is FSM, the system must add nodes and/or edges to the tree T to ensure conformance with Equation (3).

The present design computes a GCT $T_{suf}$ by taking T and adding, as nodes, all suffixes of the nodes of T. Addition of a node may cause a composite edge, or an edge labeled with more than one single letter string, to split. If, for example, w is a node of T with an outgoing edge uv, and the construction of the suffix tree calls for adding the node wu, the edge w→wuv is split into w→wu→wuv.

$T_{suf}$ is a "refinement" of T, where refinement means a "refinement function" g exists such that $s_T(x)=g(s_{T_{ref}}(x))$ for every string x. In other words, given the state assigned by $T_{suf}$ to a string x, the system can determine the state assigned by T even if x is unknown. A GCT can be refined by or be a refinement of an FSM or another GCT. A "minimal" refinement of a GCT T which is FSM, but is not necessarily a GCT, is called an "FSM closure" of T, where minimal in this context indicates having a minimal number of permanent states. $T_{suf}$ is one possible FSM closure of T.

Figure 5:
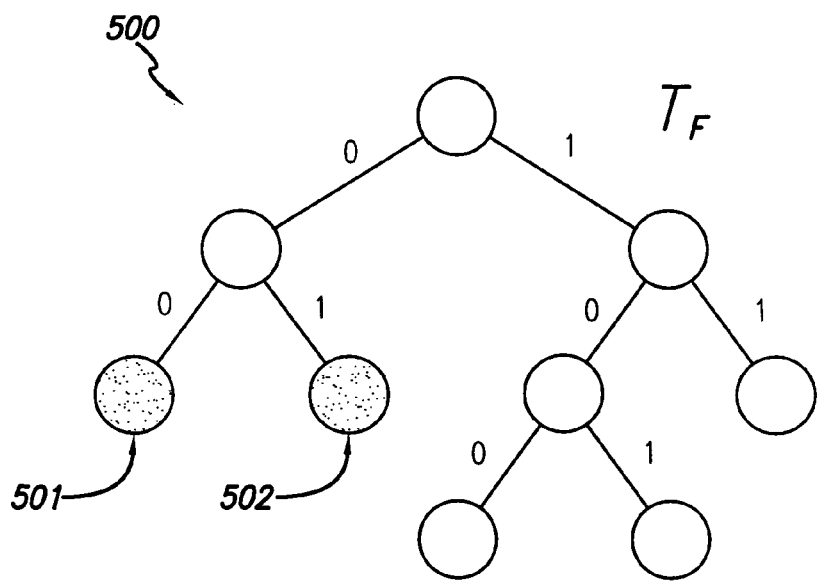
FIG. 5 shows an FSM closure of the non-FSM closed binary context tree of FIG. 4, including two new leaves.
Figure 6:
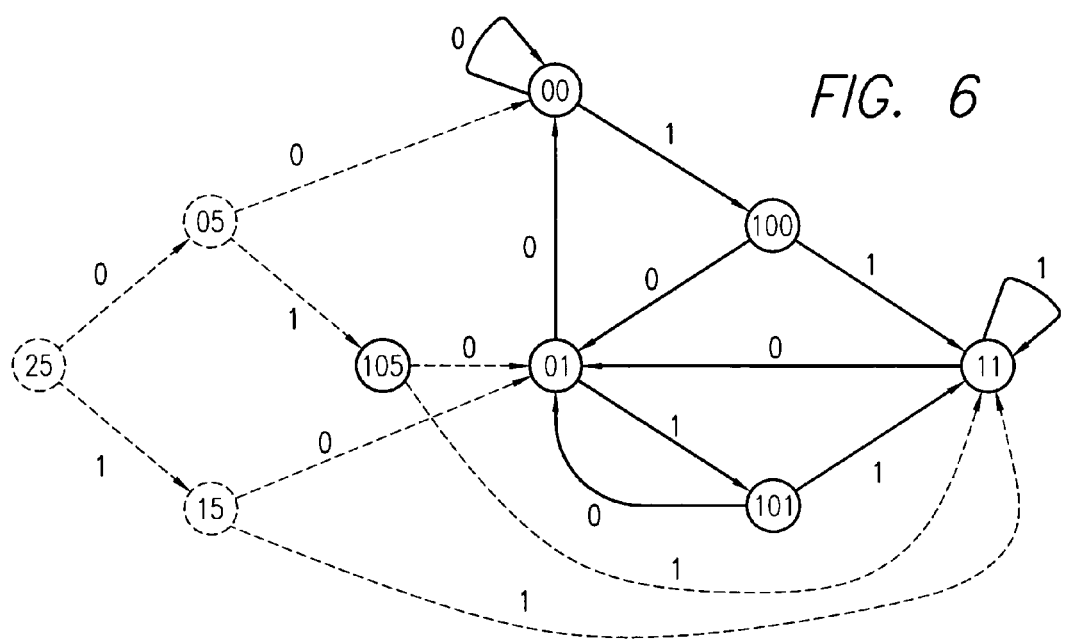
FIG. 6 shows the finite state machine associated with the $T_f$ of FIG. 5.

FIG. 5 illustrates a GCT $T_F$ having FSM properties which is an FSM closure of the tree of FIG. 4. New nodes 501 and 502 added to the tree T are shaded. FIG. 6 shows the finite state machine associated with the tree $T_F$ of FIG. 5. Transient states and their transitions are indicated by dashed lines.

An efficient method for building $T_{suf}$ is disclosed in U.S. patent application Ser. No. 10/768,904, entitled "FSM Closure of Generalized Tree Models," inventors Alvaro Martin et al., again which is incorporated herein by reference. The method may operate in a time frame linear in the sum of edges lengths over all edges of T and the number of nodes in $T_{suf}$. The algorithm begins with a representation of T and adds the necessary nodes and edges to construct $T_{suf}$. The algorithm also builds a structure Transitions[w] that determines the next-state function for each permanent state w and for each transient state w$ such that w is also a node of $T_{suf}$. An additional structure, Origin[w], associates to each node w in $T_{suf}$ the original node in T from which w descends, i.e., provides the refinement function from $T_{suf}$ into T.

A GCT T and a set of probability distributions on symbols of the alphabet conditioned to states of T can be used as a model for a finite memory source. Such a model is termed a Generalized Context Tree Model (GCT Model). The probability assigned by a GCT model with tree T to a string $x^n$ is:

$$P(x^n) = \prod_{i=1}^{n} P(x_i | s_T(x^{i-1})) \quad (4)$$

where P(a|s) is the probability of symbol a conditioned on the state s.

Universal Coding for the Class of Tree Models

The present design implements the semi-predictive variant of Context in time linear in the length of the input string. This variant operates in two passes for the encoder side. In a first read of the input string $x^n=x$, the system determines an optimum full tree for coding x, where optimum is a relative term meaning a full tree supporting a model that minimizes the code length. The supported model changes dynamically during the encoding process. The system encodes the optimum full tree as a binary sequence and sends the binary sequence to the decoder. In a second pass, the system sequentially encodes x using an arithmetic encoder. The system computes the probabilities used by the arithmetic encoder according to the same dynamic tree model, by calculating a conditional probability for each symbol of the string one at a time. The probability calculated for $x_i$ is based on statistics of symbol occurrences kept in the state $s_T(x^{i-1})$ in the optimum full tree. The total probability assigned to x is the product over all probabilities assigned to each symbol $x_i$. One such sequential probability assignment the system may use is the Krichevsky-Trofimov (KT) assignment, which assigns a probability $$p(x_{j+1} = a) = \frac{2n_{s,a}(x^j) + 1}{2 \sum_{a \in A} n_{s,a}(x^j) + \alpha} \quad (5)$$

where $n_{s,a}(x^j)$ denotes the number of times symbol a was encoded in state $s=s_T(x^j)$ during process of $x^j$.

The decoder operates by first receiving the binary sequence describing the optimum tree and reconstructing the tree. The system uses an arithmetic decoder to sequentially decode each symbol of x. As the state used by the encoder to encode $x_i$ depends only on past symbols $x_1 \ldots x_{i-1}$, decoded before $x_i$, the decoder determines the same state in the tree model and uses the same statistics as the encoder, thereby calculating the same probability distribution to decode $x_i$.

Embodiments of the encoding and decoding algorithms of the present design are illustrated in FIGS. 7-12.

Encoding

Figure 7:
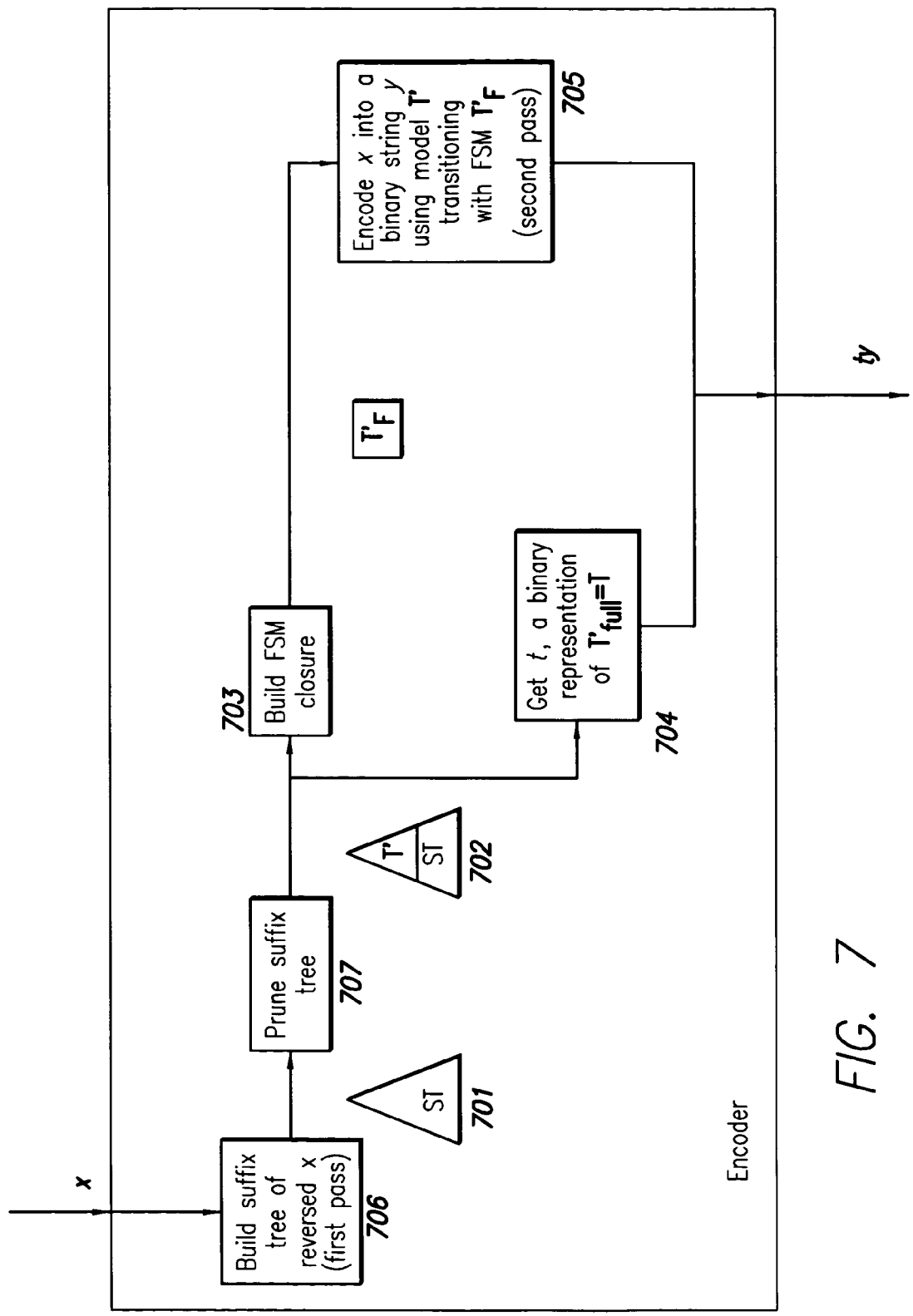
FIG. 7 shows a graphical representation of operation of an encoder according to an embodiment of the present design.

From FIG. 7, the encoder receives the string x and builds a suffix tree of the reversed x in its first pass at point 706, represented by suffix tree ST 701. The encoder prunes the suffix tree into a GCT T', or T'(x), at point 707 as shown as the top half of pruned suffix tree triangle 702. The encoder passes T'(x) along two paths, the first being to build an FSM closure of T'(x) into T'$_F$, shown as box 703, and the second to obtain t, a binary representation of the full tree T'$_{full}$, the full representation of the pruned tree T'(x), at box 704. The full tree T'$_{full}$ is the optimum coding tree T(x) for x. The encoder then encodes x into a binary string y using states in T' transitioning with finite state machine T'$_F$ in the second pass shown in box 705. The encoder uses T'$_F$ to transition efficiently from one state to the next state, but the states that determine the set of statistics the encoder uses for coding are still according to T', which may have fewer states than T'$_F$. The output of the encoder is then ty, a binary representation t of T'$_{full}$ concatenated with binary string y.

The coding process may be performed at the encoder in two encoding passes. In the first pass, the system computes a relatively optimum coding tree T(x) for a string x by minimizing an appropriate cost function that accounts for the number of bits needed for representing the optimum coding tree as a binary sequence, plus the code length for x using a statistical model based on the full tree T(x). For encoding T(x), a representation known to those skilled in the art as natural encoding may be used to encode the information, requiring one bit per node. The code length for x depends on the method of assigning symbol probabilities based on statistics maintained in the tree states. The KT assignment is one example of such an assignment. The present design computes a GCT T'(x), or T', where T' is the GCT obtained from T(x) by deleting all nodes that did not occur as substrings of $\bar{x}$, as well as any node u whose outgoing degree becomes one (1) after deleting those nodes, except if $\bar{u}$ is a prefix of x. The present design then derives T(x) as T'$_{full}$.

The system derives T'(x) by first constructing ST(x), the suffix tree of $\bar{x}^{n-1}\$$, and then "pruning" the suffix tree, with the possible insertion of additional nodes. Except for these additional nodes, which may be inserted to account for the fact that incoming edges of the leaves of T'(x) must be atomic, T'(x) is a subtree of ST(x). In a postorder traversal of ST(x), the program compares, for each node u, the sum of costs of the optimal subtrees rooted at all its children, with the cost of making u' a leaf, where u'≤u and |u'| is equal to $|PAR_{ST(x)}(u)|$ plus one, where PAR is the parent of the node in question, or u' is equal to the root if u is equal to the root. The program may perform this comparison by recursively associating to each internal node visited the cost:

$$K(u) = \min(\alpha(|u|-|u'|+1)] + \Sigma K(w), k(x^n, u)) \qquad (6)$$

where summation is performed for all w that are elements of children in ST(x) of u, and k(x", u) is the code length obtained for symbols of x encoded in state u using the KT sequential probability assignment, calculated as follows:

$$k(x^n, u) \triangleq \log \frac{\Gamma(n_s(x^{n-1}) + \frac{\alpha}{2})\Gamma(\frac{1}{2})^{\alpha}}{\Gamma(\frac{\alpha}{2})\prod_{a \in A}\Gamma(n_{s,a}(x^n) + \frac{1}{2})}. \qquad (7)$$

In Equation (7), $n_s(x^{j-1})$ denotes the number of occurrences of state s in the sequence $s_T(\lambda), s_T(x^1), s_T(x^1x^2), \ldots s_T(x^{j-1})$, $1 \le j \le n$, $\Gamma$ is the gamma function, and $n_{s,a}(x^j)$ denotes the number of occurrences of a at state s in $x^j$. The system recursively computes these values or counts as the sum of the corresponding counts over all children of s. The recursion starts from the leaves u$ of ST(x). The symbol a that follows $\bar{u}$ in x can be recorded during the suffix tree construction and associated to the leaf u$. The cost of a leaf of ST(x) is defined as log α. The program then marks u' as a leaf in case a minimum is achieved by the second argument in the right-hand side of Equation (6).

A pruning function may be implemented using a function prune(u) that prunes the subtree rooted at u and returns K(u) from Equation (6). The function prune(u) may begin by calling recursively prune(w) for all children w of u and accumulating the returned values in a variable, such as a variable Y. This accumulation accounts for the summation in the first argument of Equation (6). Adding α(|u|–|u'|+1) to Y provides the first argument.

The second argument of Equation (6) is calculated as stated in Equation (7) and stored in a variable, such as variable Z. Equation (6) indicates the program takes the minimum of both arguments, so if Y is less than Z, prune(u) returns Y. If Z is less than or equal to Y, prune(u) deletes the entire subtree rooted at u, adds u' as a leaf, and returns Z as the cost.

Once the system determines T'(x), or T', the system may compute T(x) as $T'_{full}$, where $T'_{full}$ is the tree obtained from T'(x) by adding all nodes necessary to become a full tree. The system encodes full tree T(x) with a natural code, which can be specified recursively with a pre-order traversal of T(x), to obtain the bitstream t, which can be sent to the decoder.

The second phase begins by building $T'_F(x)$, an FSM closure of T'(x). For every permanent (non-transient) state w of $T'_F(x)$, and every symbol c, the encoder has access to the next state transition f(w,c) via the data array Transitions[w]. The Transitions data array also provides state transitions for all transient states associated with nodes. Further, the link Origin[w] points to the state of T(x) being refined by w, which accumulates all statistics for the associated probability assignment. Equipped with these structures, the encoder 101 proceeds to encode sequentially symbols of x requiring a constant bounded time for each symbol using an arithmetic encoder.

Decoding

One implementation of a decoder that has access to the GCT T'(x) is a decoder operating in a manner analogous to the second encoding phase described above. After building $T'_F(x)$, such a decoder would mimic the encoder 101 by assigning the same probability to $x_i$ based on both T'(x) and $x^{i-1}$, sequentially available to the decoder as previous symbols are decoded, where an arithmetic decoder would decode $x_i$. However, the bitstream t made available from the encoder 101 only describes T(x) to the decoder 102, not T'(x). One implementation of the decoder 102 could apply the same procedure as a decoder knowing T'(x), using T(x) instead of T'(x) to recover x. One problem with such an approach is that the FSM closure of T(x) may produce a relatively large number of nodes, which adversely affects the complexity of the system. Another approach enables the encoder 101 to transmit T'(x), instead of T(x) through the bitstream t. However, the description of T'(x) increases the number of bits in t since T'(x) may not be a full tree. One way of describing T'(x) is by sending an additional bit for each node of T(x) specifying whether each node is a node of T'(x). In this implementation 2|t| bits sufficiently describe T'(x). Such an encoder would produce a code length which retains the asymptotic optimality properties of the code, but which is larger than necessary.

Rather than transmitting T'(x), increasing the number of coding bits, or building the FSM closure of T(x) increasing the complexity of the system, three solutions may be employed to provide the information at the decoder at low complexity and without extra bits: Decoding using an incomplete FSM closure, decoding using an incremental FSM closure construction, and decoding using incremental suffix tree construction. Decoding using an incomplete FSM closure computes the FSM closure of a tree containing a subset of the nodes of T'(x). The decoder determines the state in T(x) using this subset of nodes, requiring additional processing after each FSM state transition, thereby decoding the string x using the same statistics as the encoder. Decoding using incremental FSM closure construction operates in a similar manner to decoding using an incomplete FSM closure, but rather than recalculating the state in T(x) corresponding to a certain state s in the FSM each time s is visited, the decoder expands the FSM closure to accommodate new states and eventually becomes equal to $T'_F(x)$, the FSM closure of T'(x) employed by the encoder. The third decoding alternative, decoding using incremental suffix tree construction, does not use an FSM closure. Instead, the decoder expands T(x) by adding all suffixes of $\bar{x}$ sequentially as symbols are decoded. The decoder can determine the state in T(x), using the same statistics as the encoder, by maintaining the nearest ancestor originally existing in T(x) for each added node.

In all of these cases, decoding occurs by loop processing one symbol at a time from the string, beginning at symbol $x_1$ and processing up to $x_n$. As used herein, sub index i denotes instant values of variables at the time i for symbols already decoded. For example, if s denotes a state on a context tree, $s_i$ denotes value of s before decoding symbol $x_{i+1}$.

Figure 8:
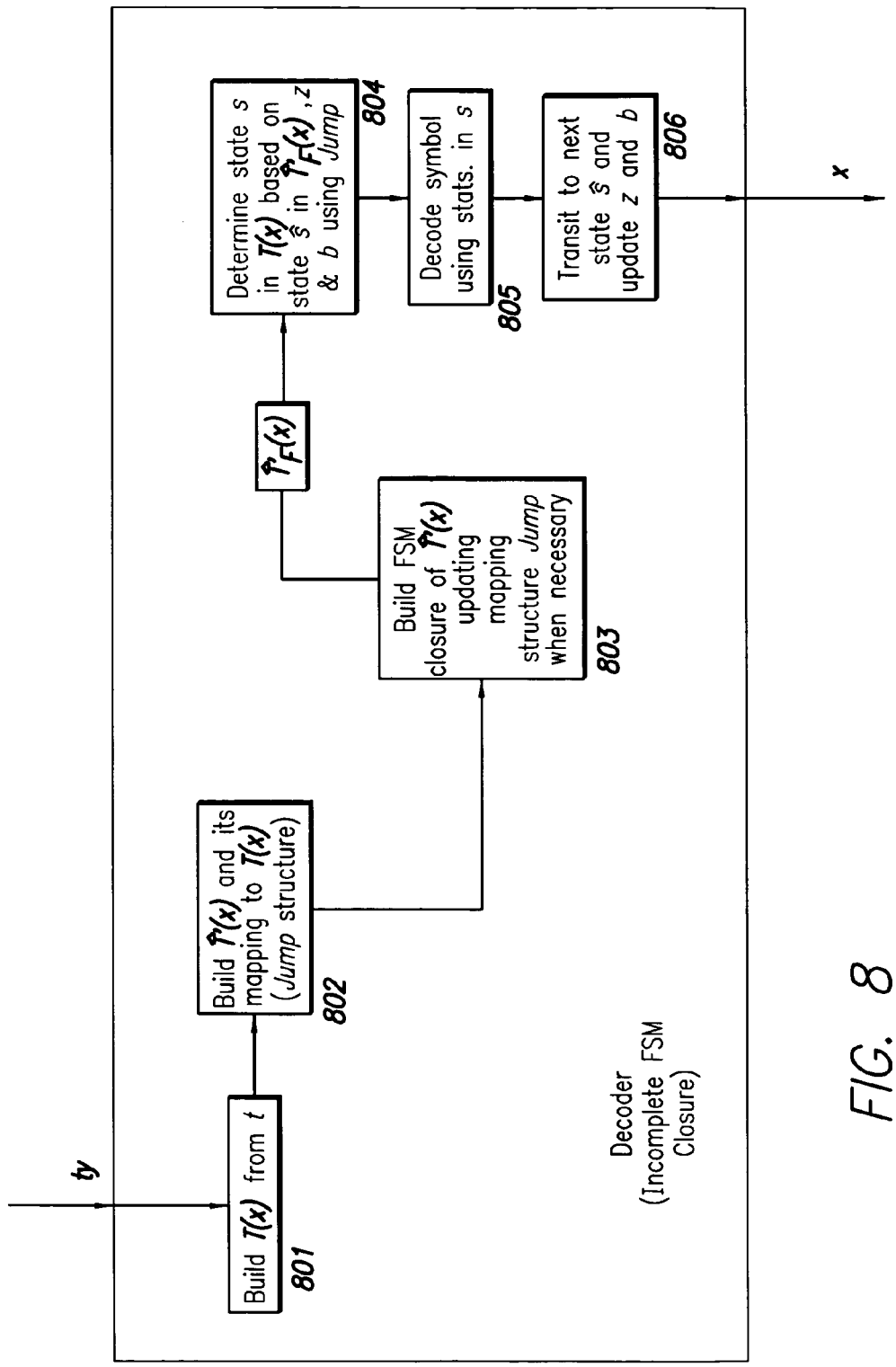
FIG. 8 is a graphical representation of one embodiment of the decoder using the concept of an incomplete FSM closure.
Figure 11:
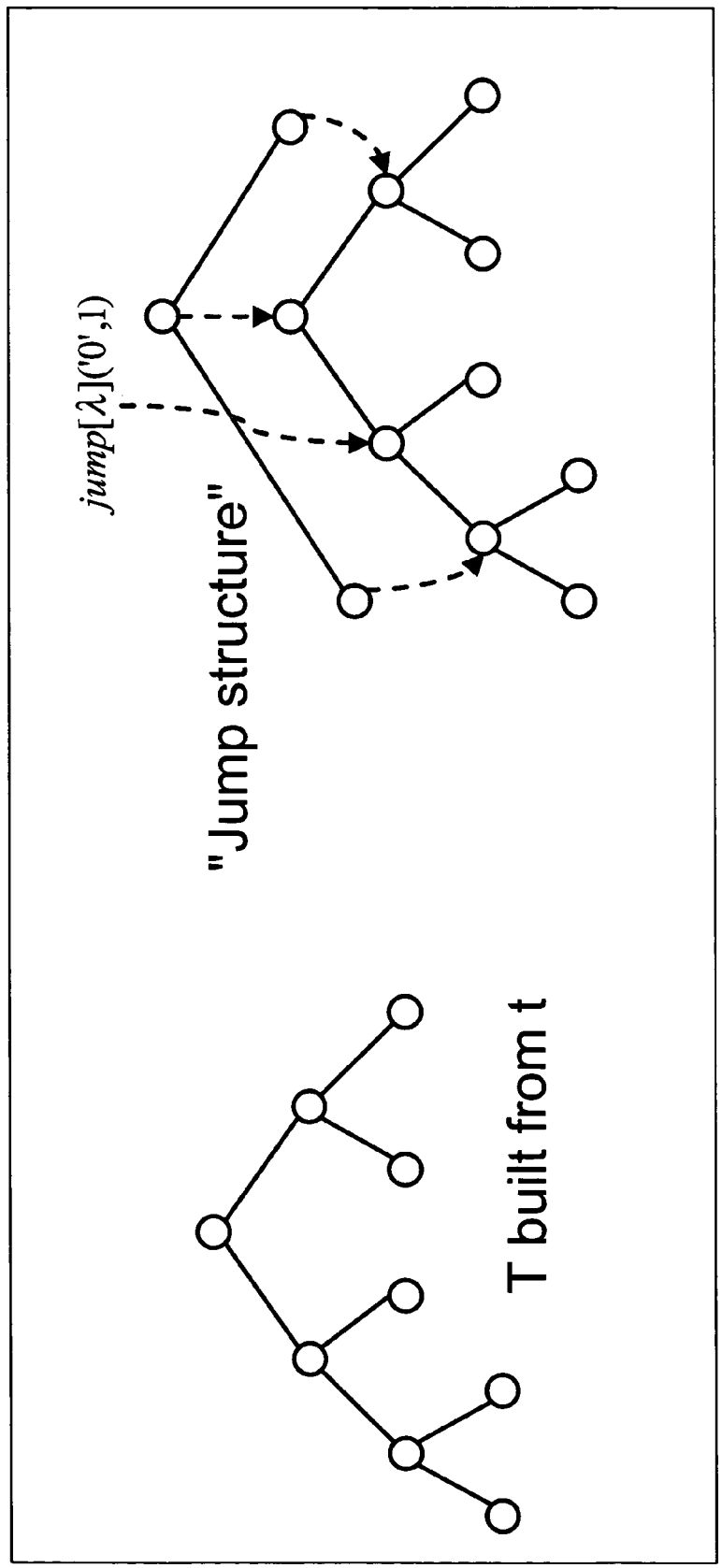
FIG. 11 illustrates the concept of a Jump structure and creation thereof.

FIG. 8 illustrates a conceptual flow diagram of an embodiment of the decoder building an incomplete FSM closure. The decoder receives ty from the encoder, and builds a tree T(x) from the t string received at point 801. The decoder then builds $\hat{T}'(x)$, a tree obtained from T(x) by deleting all leaves and also all nodes whose number of children after deleting leaves is 1, at point 802. A mapping to T(x), known as a Jump structure, may also be built at this point. A sample Jump structure, explained below, is illustrated in FIG. 11. The decoder then builds an FSM closure of $\hat{T}'(x)$, updating the mapping structure Jump when appropriate, at point 803. The result is $\hat{T}'_F(x)$, which passes into a loop beginning with point 804. The present design links each state $\hat{s}_i$ to $s_i$, where $s_i$ is the state required by decoder 102 and $\hat{s}_i$ is the available state in the FSM $\hat{T}'_F(x)$. The link is given by defining $z_i$ to be such that $\hat{s}_i z_i$ is the longest prefix of $\overline{x}^i$ that is a word of $\hat{T}'_F(x)$, where the $ symbols were removed from transient states. Further, $b_i$ is defined as $x_{i-|\hat{s}_i z_i|}$ if $|\hat{s}_i z_i|$ is less than i, and λ otherwise. Based on these definitions, the state $s_i$ can be determined as $s_i = \hat{s}_i z_i b_i$.

Point 804 determines state s in T(x) based on state $\hat{s}$ in $\hat{T}'_F(x)$, z, and b using the Jump mapping structure. Point 805 decodes the symbol using statistics corresponding to state s. Point 806 transitions to the next state $\hat{s}$ and updates z and b. Point 806 cycles back to point 804 and these last three points repeat until all symbols in x have been determined by the decoder 102.

The Jump structure of FIG. 11 illustrates the data structure Jump[u], whose goal is to facilitate determination of $s_i$ in constant time per input symbol, without revisiting the decoded sequence for all the symbols in $z_i$. For every internal node u of T(x) that is also a node of $\hat{T}'(x)$, the set $A_u$ of symbols may exist for which u has an edge of $\hat{T}'(x)$ in the direction of the symbols, and u(a) denotes the edge of $\hat{T}'(x)$ in the direction of a $\in A_u$. For every j, $v_{u,a}(j)$ denotes the node of T(x) obtained by concatenating the first j symbols of the label of the edge u(a) to u. The data structure Jump[u] links u with each $v_{u,a}(j)$ and may be produced by the system in linear time for all relevant nodes, such as by setting up the Jump data structure for the nodes of $\hat{T}'(x)$ and updating the data structure as edges of $\hat{T}'(x)$ are split by the algorithm.

FIG. 12 represents an embodiment of the decoder implementation that builds an incomplete FSM closure using T(x) received from the encoder. From FIG. 12, line 1 sets $\hat{T}'(x)$ equal to a compacted version of T(x) minus the leaves of T(x), where "compact" simply indicates eliminating nodes with exactly one child. Reassignment or removal of these intermediate nodes in the tree provides a compacted tree structure that can be FSM closed with relatively low complexity. Line 2 of FIG. 12 computes $\hat{T}'_F(x)$, an FSM closure of $\hat{T}'(x)$. Line 3 sets $\hat{s}$, a pointer, to point to the root node of the FSM closed tree $\hat{T}'_F(x)$. Line 4 sets the variables zlength to 0 and b equal to the root node, where zlength is a string length and b is a symbol or λ.

The present design recursively determines zlength, which has the value of $|z_i|$ for each iteration, starting with $z_0$ equals λ, by checking decoded symbols and descending $\hat{T}'_F(x)$ starting from $\hat{s}_i$. Only up to $|u_i|+1$ symbols may be checked where $u_i$ is defined as the string satisfying $x_i \hat{s}_{i-1} = \hat{s}_i u_i$. If at some point, the concatenated string is not a word of $\hat{T}'_F(x)$, zlength is the current length. Otherwise, zlength is equal to $|u_i|+|z_{i-1}|$.

Line 5 begins a While loop that operates until the end of the input received from the encoder, and line 6 begins an if statement determining whether zlength is greater than zero. If zlength is greater than zero, line 7 determines head(z) using symbols that have been decoded. At line 8, if pointer $\hat{s}$ is an internal node of T(x) and head(z) is a member of $A_{\hat{s}}$, the set of symbols for which $\hat{s}$ has an edge in the direction of the symbols, the subroutine sets s equals $\hat{s}zb$. Line 9 begins a series of elseif commands providing alternates to line 8, where line 9 checks if pointer $\hat{s}$ is an internal node of T(x) and head(z) is not a member of $A_{\hat{s}}$. In this case, s is set to $\hat{s}$head(z). Line 10 evaluates whether $\hat{s}$ is a leaf of T(x), and if so, sets s equal to $\hat{s}$. Line 11 is the default, setting s equals Origin($\hat{s}$). If zlength is not equal to zero, lines 14 and 15 evaluate whether $\hat{s}$ is a node of T(x), and if so, sets s equal to $\hat{s}$, otherwise, sets s equal to Origin($\hat{s}$). At line 17, the subroutine decodes the next symbol using statistics conditioned on s, then updates the statistics in s, sets $\hat{s}$ to the next state in $\hat{T}'_F(x)$ according to the decoded symbol, and updates the values of zlength and b. Line 21 ends the While loop begun at line 5.

Figure 9:
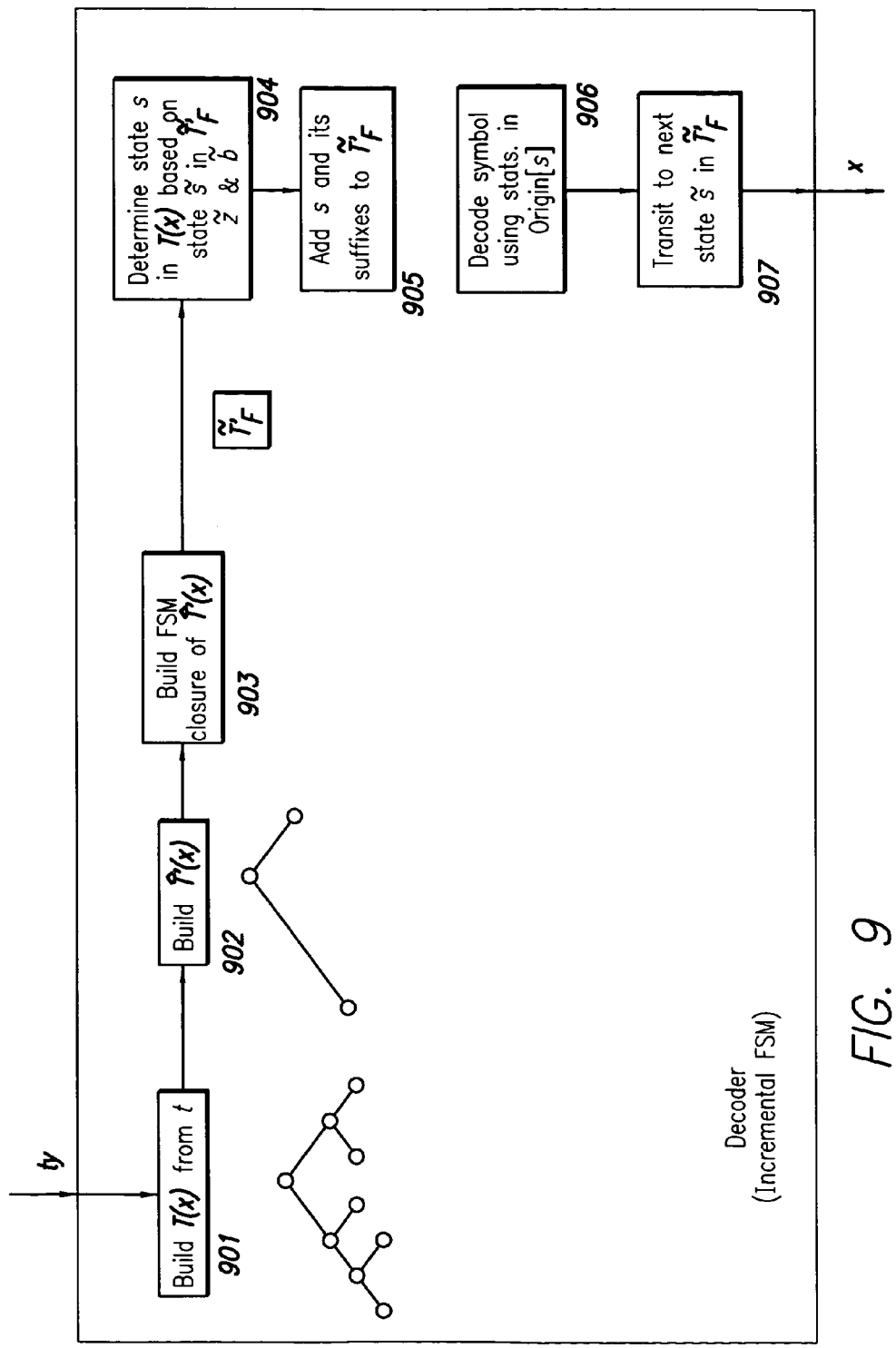
FIG. 9 illustrates a graphical representation of an additional embodiment of the decoder using the concept of an incremental FSM closure construction.

FIG. 9 illustrates a conceptual flow diagram of an embodiment of the decoder that builds an incremental FSM. Again, the decoder receives ty from the encoder. At point 901, the decoder builds the tree T(x) from the bitstream t received. At point 902, the decoder builds $\hat{T}'(x)$ and builds an FSM closure of $\hat{T}'(x)$ at point 903. This FSM closure is represented as $\tilde{T}'_F$. $\tilde{T}'_F$ passes to the loop beginning at point 904, which determines the state s in T(x) based on state $\tilde{s}$ in $\tilde{T}'_F$, $\tilde{z}$, and $\tilde{b}$. $\tilde{z}$ and $\tilde{b}$ are similar to z and b defined above, but for the FSM closure $\tilde{T}'_F$. The value of $\tilde{z}$ for each i, $\tilde{z}_i$, is such that $\tilde{s}_i \tilde{z}_i$ is the longest prefix of $\overline{x}^i$ that is a word o $\tilde{T}'_F$. Further, $\tilde{b}_i$ is defined as $x_{i-|\tilde{s}_i \tilde{z}_i|}$ if $|\tilde{s}_i \tilde{z}_i|$ is less than i and $\tilde{s}_i \tilde{z}_i x_{i-|\tilde{s}_i \tilde{z}_i|}$ is a node of the FSM closure of T(x), $T_F(x)$, and λ otherwise. Based on these definitions, the state $s_i$ is equal to $\tilde{s}_i \tilde{z}_i \tilde{b}_i$. Point 905 adds s and its suffixes to $\tilde{T}'_F$. Point 906 decodes the symbol using the statistics in Origin[s], while point 907 transitions to next state $\tilde{s}$ in $\tilde{T}'_F$. These final four points repeat within the decoder until all states in T(x) are determined. The decoder then provides x based on these states.

FIG. 13 illustrates a subroutine for decoding using an incremental FSM closure. Line 1 sets T'(x) equal to a compacted version of T(x) minus the leaves of T(x), similar to line 1 of FIG. 12. Line 2 of FIG. 12 computes $\tilde{T}'_F$, an FSM closure of T'(x). Line 3 sets $\tilde{s}$, a pointer, to point to the root node of the FSM closed tree $\tilde{T}'_F$. Line 4 sets the variables $\tilde{z}$length to 0 and $\tilde{b}$ equal to the root node. Line 5 begins a While loop that operates until the end of the input received from the encoder, and line 6 begins an if statement determining whether $\tilde{z}$length is greater than zero. If $\tilde{z}$length is greater than zero, line 7 determines head($\tilde{z}$) using the symbols already decoded. Line 8 creates node $\tilde{s}\tilde{z}$ by splitting the edge departing or emanating from $\tilde{s}$ having the first symbol head($\tilde{z}$). Line 9 sets r equal to $\tilde{s}\tilde{z}$, and line 10 sets the Transitions(r) array equal to the Transitions array for $\tilde{s}$, where the initial structure Transitions[w] was generated by the algorithm that built the FSM closure and determines the next-state function for each permanent state w and for each transient state w$ such that w is also a node of the FSM closure. Line 11 Verifies r, where the Verify* subroutine is employed at this point with argument r.

Verify* is identical to the Verify routine discussed in detail in U.S. patent application Ser. No. 10/768,904, entitled "FSM Closure of Generalized Tree Models," inventors Alvaro Martin et al., again which is incorporated herein by reference, except for an update to the Origin data array and incoming and outgoing transitions during node insertions. For a node uv created in $\tilde{T}'_F$ as a leaf child of u, the system sets Origin[uv] to uv if u is an internal node of T(x), or to Origin[u] otherwise. If the system creates uv by splitting an edge $$u \xrightarrow{vy} uvy \text{ into } u \xrightarrow{v} uv \xrightarrow{y} uvy,$$

the system sets Origin[uv] to uv if uv is an internal node of T(x), or to Origin[uvy] otherwise. The result is that for any leaf u of T(x), Origin[uv] is equal to Origin[uw] for all nodes uv and uw of $\tilde{T}'_F$. If c is equal to head(w), Verify*(w) sets f(y,c) equal to w in Transitions[y] for node y equals tail(w) and also for all descendants yt that share its same value for f(yt,c) equals f(y,c). In addition, if the system creates y as a new child of t, the Verify* routine sets f(y,c') equal to f(t,c') in Transitions[y] for all c' that are elements of A and different from c.

From FIG. 13, the decoder then proceeds by evaluating whether $\tilde{z}$ length is equal to zero, and if so, sets r equal to $\tilde{s}$ at line 13. If $\tilde{b}$ is not a zero length string, line 16 creates the node r$\tilde{b}$, line 17 sets Transitions of r$\tilde{b}$ equal to Transitions for r, and line 18 calls the Verify* subroutine with the r$\tilde{b}$ argument. Line 19 sets s equal to r$\tilde{b}$. If $\tilde{b}$ is a zero length string, s is set equal to r. Line 23 decodes the next symbol using the statistics in Origin(s), line 24 updates the statistics in Origin(s), line 25 sets $\tilde{s}$ to the next state in $\tilde{T}'_F$ according to the decoded symbol, and line 26 updates the values of $\tilde{z}$length and $\tilde{b}$. As with the previous zlength, the present design recursively determines $\tilde{z}$length, or $|\tilde{z}_i|$, starting with $\tilde{z}_0$ equals $\lambda$, by checking decoded symbols and descending $\tilde{T}'_F$ starting from $s_i$. The decoder may check up to $|\tilde{u}_i|+1$ symbols. $\tilde{u}_i$ is defined as equal to $\lambda$ if $|\tilde{s}_i| > |\tilde{s}_{i-1}|+1$, or as the string satisfying $x_i \tilde{s}_{i-1} = \tilde{s}_i \tilde{u}_i$ otherwise. If at some point, the concatenated string is not a word of $\tilde{T}'_F$, $\tilde{z}$length is the current length. Otherwise, $\tilde{z}$length is equal to $|\tilde{u}_i|+|\tilde{z}_{i-1}|$. Line 27 ends the While loop.

Determining whether a node u is an internal node of $T_F(x)$ may employ an extra Boolean flag Internal[u], computed incrementally for every node of $\tilde{T}'_F$. Internal[u] is initially true for all nodes, and the system sets Internal[u] false for all nodes added to build $\tilde{T}'_F$, except those nodes created by splitting an edge $$u \xrightarrow{vy} uvy \text{ into } u \xrightarrow{v} uv \xrightarrow{y} uvy$$

where Internal[uvy] is true. A similar technique may be used to determine whether a node is an internal node of T(x). Further, transition propagations in Verify* may employ a representation of Transitions[u] that groups all transitions of all nodes leading to the same destination in one location. All nodes uy having a transition f(uy, a) equal to au maintain a pointer Transition[uy, a] to a cell that points to au. The system updates all descendents sharing the same transition by changing the value of the cell Transition[uy,a] and creating a new value for all nodes in the path between u and uy, excluding uy.

Figure 10:
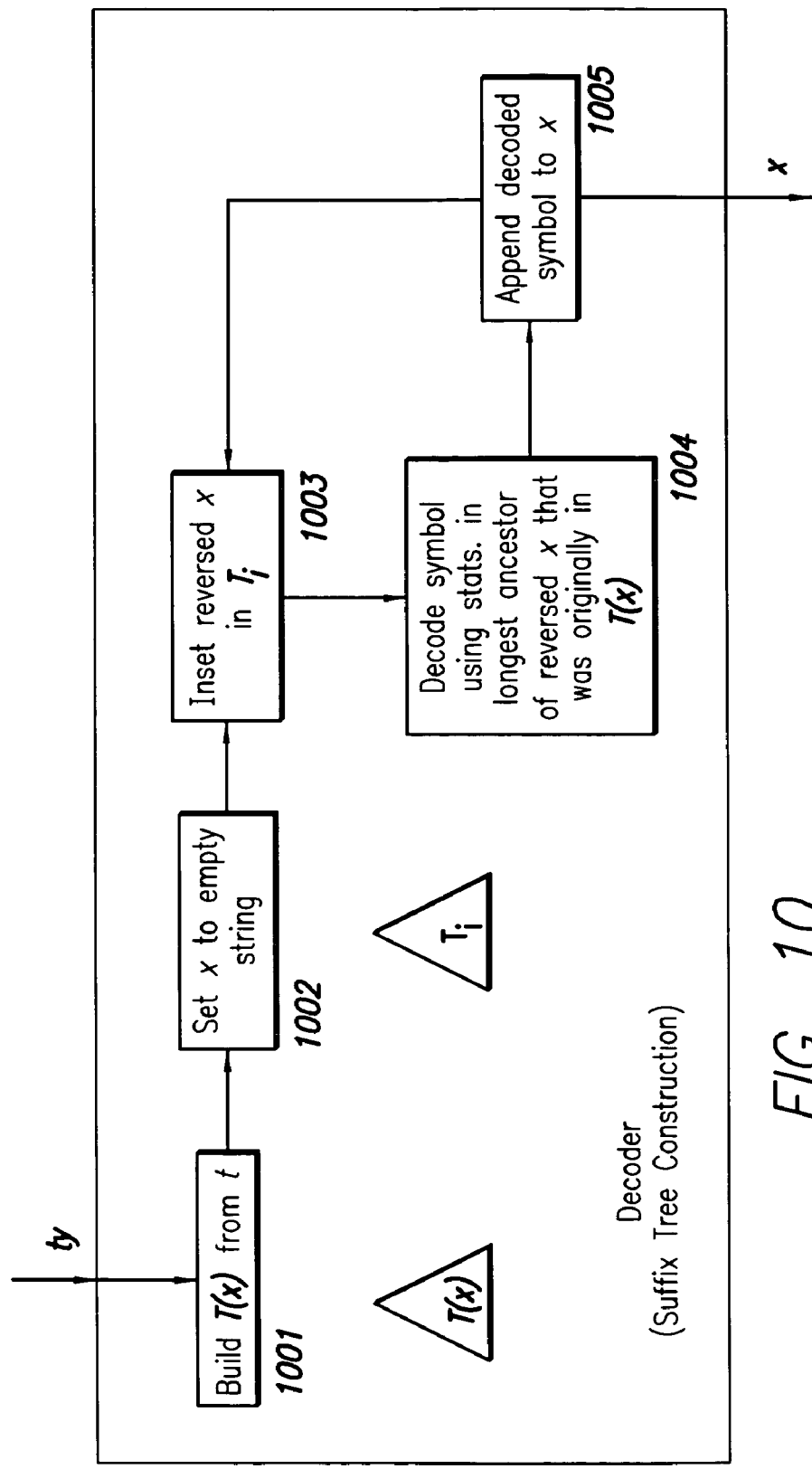
FIG. 10 shows a graphical representation of a further embodiment of the decoder using the concept of incremental suffix tree construction.

FIG. 10 illustrates a conceptual flow diagram of an embodiment of the decoder using suffix tree construction. The decoder receives ty, and builds tree T(x) from t at point 1001. The decoder then sets x to the empty string at point 1302. Point 1003 places the reversed x, now an empty string, in $T_i(x)$, where $T_i(x)$ denotes a successively updated tree initialized as $T_0(x)$, originally equal to T(x). Point 1004 decodes the symbol using statistics in the longest ancestor of the reversed x that was originally in T(x). Point 1005 appends the decoded symbol to x, and passes the new value of x to point 1003. Points 1003 through 1005 repeat until all symbols have been decoded.

FIG. 14 illustrates a subroutine for decoding using incremental suffix tree construction. The algorithm employs short-cut links for each node and each symbol of the tree. The short-cut link for a node u and a symbol a points to node auv, where v is the shortest string such that auv is an element of T(x) or is undefined if no such node exists. The algorithm starts by initializing short-cut links for all nodes in the initial tree T(x) and incrementally updates the structure as the system inserts additional nodes. Common statistics are accessed by keeping a pointer to the nearest ancestor originally in T(x) in each inserted node. While constructing $T_i(x)$, the system searches for the longest prefix $r'_i$ of the suffix being inserted, $\bar{x}^i$, that is a word of the previous tree, $T_{i-1}(x)$. This longest prefix is the insertion point for the new suffix $\bar{x}^i$. $r_i$ is the longest prefix of $\bar{x}^i$ that is a substring of $\bar{x}^{i-1}$. $r_i$ is a prefix of $x_i r_{i-1}$, $x_i$ being a symbol, and $r'_i$ is equal to $r_i u_i$ for some string u.

Construction of $T_i(x)$ starts from a node $r'_{i-1}$ where $r'_0$ is $\lambda$, and traverses the tree upward until it reaches the first ancestor of $r'_{i-1}$ that has a short-cut link defined for symbol $x_i$ or the root is reached. This is called an upward traversal, and $v_i$ denotes the node found in an upward traversal and $w_i$ the node pointed to by the corresponding short-cut link, or the root if no short-cut link exists. The algorithm also performs a downward traversal, from $w_i$ to $r'_i$, comparing symbols in the path with previously decoded symbols. Once the algorithm has determined $r'_i$, the algorithm adds a new leaf representing $\tilde{x}^i$, and assigns short-cut links to all nodes in the unsuccessful portion of the upwards traversal pointing to the new leaf for symbol $x_i$.

As shown in FIG. 14, line 1 initializes short-cut links for T(x). Line 2 sets variables r' and s equal to the root node. Line 3 begins a While loop that evaluates all input received. Line 4 decodes $x_i$ using the statistics in s, and traverses upward at line 6 et seq. by setting v equal to r'. While v is not the root node, and v has no short cut link for $x_i$, line 8 sets v equal to the parent of v. Line 9 ends the While loop begun at line 7. At line 10, if v has a short cut link for $x_i$, line 11 sets w equal to the node pointed to by the short cut link of v for $x_i$. Otherwise, w is set equal to the root at line 13. If the length of string w is greater than the length of string v plus one, line 16 splits the edge from the parent of w to w by inserting the node $x_i v$. Line 17 sets $r_{new}$ equal to $x_i v$, while line 18 sets u equal to v. While the short cut of u for $x_i$ is equal to w, line 20 sets a short cut link of u for $x_i$ pointing to $r_{new}$. Line 21 checks whether u is not equal to the root, and if so, sets u equal to the parent of u. If the length of string w is not greater than the length of string v plus one, the program executes a downward traversal as shown by the comment at line 24. The algorithm employs a data structure jump[$v_i$], where the algorithm constructs the jump data structure during each downward traversal to map the symbol a equal to $x_i$ and an index j to the jth traversed node in relatively constant time. This structure is a mapping between substrings y of a composite edge departing from $v_i$ into nodes $x_i v_i y$, and may be updated whenever a composite edge is split. In the algorithm, if jump[v] defines a mapping for $x_i$, the algorithm at line 26 sets $r_{new}$ equal to the last entrance of jump[v] for $x_i$. If jump[v] does not define a mapping for $x_i$, $r_{new}$ is set equal to w, and the program sets j equal to $|r_{new}|$. While i minus j is greater than zero, and $r_{new}$ has a child in the direction of $x_{i-j}$, the program sets $r_{new}$ equal to a child of $r_{new}$ in the direction of $x_{i-j}$. Line 32 updates jump[v]. Line 33 increments j, and the program ends the While loop and If statements from lines 30, 25, and 15. Line 37 adds a child to $r_{new}$ representing the suffix $\bar{x}^i$. For all nodes in the path from r' to v, the program sets a short-cut link for symbol $x_i$ pointing to the new node $\bar{x}^i$. r' is set to $r_{new}$, and s is set to the longest prefix of $\bar{x}^i$ that was originally in T(x). Line 43 ends the While loop begun at line 3.

It will be appreciated to those of skill in the art that the present design may be applied to other systems that employ predictive coding of information sources, particularly those using data structures for finite memory sources that may be beneficially universally coded, transmitted, and decoded and having enhanced predictive capability and minimal loss of quality. In particular, it will be appreciated that various universal coding schemes using tree models and/or finite state machines may be addressed by the functionality and associated aspects described herein.

Although there has been hereinabove described a method for data compression based on tree models, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A method for encoding a sequence into a concatenated string, the method configured to be executed by a computing device, the method comprising:
building a suffix tree of the sequence in reverse order;
pruning the suffix tree to form a generalized context tree (GCT) having a plurality of states;
obtaining a binary representation of a full tree derived from the GCT;
encoding the sequence into a binary string using a dynamic tree model based on statistics collected at the plurality of states of the GCT; and
concatenating the binary representation of the full tree with the binary string to form the concatenated string.

2. The method of claim 1, further comprising:
building a finite state machine (FSM) closure of the GCT to form an FSM closed tree subsequent to said pruning.

3. The method of claim 2, wherein encoding the sequence into a binary string using a dynamic tree model based on statistics collected at the plurality of states of the GCT comprises encoding the sequence into a binary string using states in the GCT transitioning with the FSM closed tree.

4. The method of claim 1, wherein pruning the suffix tree to form the GCT comprises using a cost function to prune the suffix tree, wherein the cost function is associated with nodes of the suffix tree.

5. The method of claim 4, wherein using the cost function includes determining an overall cost, and wherein the overall cost reflects a combined length of code obtained by encoding the sequence with the full, tree and corresponding dynamic tree model, and length of the binary representation of the full tree.

6. The method of claim 2, wherein building the FSM closure of the GCT comprises adding suffix links to the GCT.

7. The method of claim 1, wherein the encoding comprises employing a Krichevsky-Trofimov (KT) probability assignment.

8. The method of claim 1, wherein the sequence is encoded into the binary string using an arithmetic encoder.

9. A method configured to be executed by a computing device for encoding a sequence into a concatenated string, comprising:
building a suffix tree of the sequence in reverse order;
pruning the suffix tree to form a generalized context tree (GCT) having a plurality of states;
building a finite state machine (FSM) closure of the GCT to form an FSM closed GCT;
obtaining a binary representation of a full tree derived from the GCT;
encoding the sequence into a binary string using a dynamic tree model based on statistics collected at the plurality of states of the GCT;
transitioning to a next state of the GCT with the FSM closed GCT; and
concatenating the binary representation of the full representation of the full tree with the binary string to form the concatenated string.

10. The method of claim 9, wherein transitioning comprises transitioning from a first state to a second state in the GCT.

11. The method of claim 9, wherein building the FSM closure of the GCT comprises adding suffix links to the GCT.

12. The method of claim 9, wherein transitioning states in the GCT employ statistics recursively collected from respective state descendants in the suffix tree.

13. The method of claim 9, wherein the sequence is encoded into the binary string using an arithmetic encoder.

14. The method of claim 9, wherein pruning the suffix tree to form the GCT comprises using a cost function to prune the suffix tree, wherein the cost function is associated with nodes of the suffix tree.

15. The method of claim 14, wherein using the cost function includes determining an overall cost, and wherein the overall cost reflects a combined length of code obtained by encoding the sequence with the full tree and corresponding dynamic tree model, and length of the binary representation of the full tree.

16. A method for decoding a binary string comprising a binary representation of a full tree having a plurality of states associated therewith and an encoded string produced by a corresponding encoder using a dynamic tree model based on the full tree, the method configured for execution on a computing device and comprising:
building a finite state machine (FSM) closure of the full tree;
iteratively decoding at least one symbol using the dynamic tree model of the corresponding encoder based on statistics collected at the plurality of states of the full tree; and
transitioning to a next state of the full tree using the FSM closed full tree.

17. The method of claim 16, wherein building the FSM closure of the full tree comprises adding suffix links to the full tree.

18. The method of claim 16, wherein the binary string is received in the form of the full tree in combination with a set of additional bits for all nodes of the full tree indicating whether the nodes of the full tree are nodes of a generalized context tree obtained by intersecting the full tree with the suffix tree of a reversed sequence of symbols represented by the binary string.

19. A method for decoding a binary string, the method configured for execution on a computing device, the binary string comprising a binary representation of a generalized context tree (GCT) and an encoded string produced by a corresponding encoder using a dynamic tree model based on the GCT, the GCT having a plurality of states associated therewith, comprising:

building a decoding GCT based on the binary representation of the GCT;

building a finite state machine (FSM) closure of the decoding GCT;

iteratively decoding at least one symbol using the dynamic tree model of the corresponding encoder based on statistics collected at the plurality of states of the decoding GCT; and transitioning to a next state of the decoding GCT using the FSM closed decoding GCT.

20. The method of claim 19, wherein the previous symbol is decoded by an arithmetic decoder.

21. A method for decoding a binary string, said binary string comprising a binary representation of a full tree and an encoded string produced by a corresponding encoder using a dynamic tree model based on the full tree, the full tree having a plurality of states associated therewith, the method configured for execution on a computing device and comprising:

building a decoding full tree based on the binary representation of the full tree;

creating a reduced generalized context tree (GCT) and mapping the reduced GCT to the decoding full tree;

building a finite state machine (FSM) closure of the reduced GCT;

iteratively decoding at least one symbol using the dynamic tree model of the corresponding encoder based on statistics collected at the plurality of states of the decoding full tree; and transitioning to a next state of the decoding full tree using the FSM closed reduced GCT.

22. The method of claim 21, wherein mapping the reduced GCT to the decoding full tree creates a jump structure.

23. The method of claim 22, further comprising updating the jump structure after said creating and mapping.

24. The method of claim 21, wherein said iteratively decoding comprises determining a state in the decoding full tree based on a corresponding state in the FSM closure of the reduced GCT using the jump structure.

25. A method configured for execution on a computing device for decoding a binary string, said binary string comprising a binary representation of a full tree and an encoded string produced by a corresponding encoder using a dynamic tree model based on the full tree, the full tree having a plurality of states associated therewith, comprising:

building a decoding full tree based on the binary representation of the full tree;

creating a reduced generalized context tree (GCT);

building a finite state machine (FSM) closure of the reduced GCT;

iteratively decoding at least one symbol using the dynamic tree model of the corresponding encoder based on statistics collected at the plurality of states of the decoding full tree;

transitioning to a next state of the decoding full tree using the FSM closed GCT; and adding encountered states from the decoding full tree and suffixes thereof to the FSM closure of the reduced GCT.

26. The method of claim 25, wherein transitioning to a next state comprises incrementing the FSM reduced closed GCT with new nodes.

27. The method of claim 25, wherein said iteratively decoding comprises determining a state in the GCT based on a corresponding state in the FSM closure of the incremented reduced tree representation.

28. The method of claim 25, further comprising verifying states and suffixes thereof added are missing from the incremented FSM closed reduced GCT.

29. The method of claim 25, wherein adding states thereof comprise adding a new node below an existing node and splitting at least one edge departing from the existing node.

30. A method configured for execution on a commuting device for decoding a binary string ty, formed by concatenating binary strings t and y into a resultant string x, said binary string ty comprising a binary representation t of a tree T and an encoded string y produced by a corresponding encoder using a dynamic tree model based on the tree T, comprising:

building tree T based on the binary representation t;

setting the resultant string x to an empty string;

iteratively decoding at least one symbol using the dynamic tree model of the corresponding encoder based on statistics collected at a state given by a longest ancestor of reversed resultant string x originally in T;

filling the resultant string x with decoded symbols; and inserting the reversed resultant string x in the tree T.

* * * * *

UNITED STATES PATENT AND TRADEMARK OFFICE
CERTIFICATE OF CORRECTION

| | | |
|---|---|---|
| PATENT NO. | : 7,265,692 B2 | Page 1 of 1 |
| APPLICATION NO. | : 10/821524 | |
| DATED | : September 4, 2007 | |
| INVENTOR(S) | : Alvaro Martin et al. | |

It is certified that error appears in the above-identified patent and that said Letters Patent is hereby corrected as shown below:

In column 5, line 63, after "of" delete "a" and insert -- $\alpha$ --, therefor.

In column 17, line 57, in Claim 5, after "full" delete ",".

In column 20, line 30, in Claim 30, delete "commuting" and insert -- computing --, therefor.

Signed and Sealed this

Twenty-second Day of July, 2008

JON W. DUDAS
*Director of the United States Patent and Trademark Office*